US012763288B2

(12) United States Patent
Pan

(10) Patent No.: US 12,763,288 B2
(45) Date of Patent: Oct. 13, 2026

(54) SYSTEM AND METHOD FOR DELIVERING PULSED RF POWER FROM A SINGLE GENERATOR TO DISTRIBUTED PLASMA SOURCES OF A SEMICONDUCTOR PROCESS SYSTEM

(71) Applicant: Yang Pan, Singapore (SG)

(72) Inventor: Yang Pan, Singapore (SG)

(73) Assignee: Inspiring Atoms Pte Ltd, Singapore (SG)

( * ) Notice: Subject to any disclaimer, the term of this patent is extended or adjusted under 35 U.S.C. 154(b) by 55 days.

(21) Appl. No.: 19/056,734

(22) Filed: Feb. 19, 2025

(65) Prior Publication Data

US 2026/0245832 A1 Aug. 20, 2026

(51) Int. Cl.
*H01J 37/32* (2006.01)
*H10P 72/00* (2026.01)

(52) U.S. Cl.
CPC ..... *H01J 37/32174* (2013.01); *H01J 37/3211* (2013.01); *H01J 37/32146* (2013.01); *H01J 2237/334* (2013.01); *H10P 72/0421* (2026.01)

(58) Field of Classification Search
CPC ............ H01J 37/32174; H01J 37/3211; H01J 37/32146; H01J 2237/334; H10P 72/0421
See application file for complete search history.

(56) References Cited

U.S. PATENT DOCUMENTS 4,948,458 A 8/1990 Ogle
5,302,240 A 4/1994 Hori et al.
6,164,241 A 12/2000 Chen et al.
6,448,192 B1 9/2002 Kaushik
7,416,989 B1 8/2008 Liu et al.
8,227,344 B2 7/2012 Selsley et al.
8,231,799 B2 7/2012 Bera et al.
8,252,194 B2 8/2012 Kiehlbauch et al.
8,264,154 B2 9/2012 Banner et al.
8,808,561 B2 * 8/2014 Kanarik ............ H01J 37/32146 204/192.32
8,883,028 B2 * 11/2014 Kanarik ............ H01J 37/32082 216/68
9,130,158 B1 9/2015 Shen et al.
9,257,638 B2 2/2016 Tan et al.
9,362,131 B2 6/2016 Agarwal et al.
9,576,811 B2 2/2017 Kanarik et al.
9,620,382 B2 4/2017 Oehrlein et al.
(Continued)

OTHER PUBLICATIONS

COBURN and WINTERS, "Ion-and electron-assisted gas-surface chemistry-an important effect in plasma etching", J. Appl. Phys. 50, 1979, pp. 3189-3196.
(Continued)

*Primary Examiner* — Minh Tran

(57) ABSTRACT

Disclosed is a system and method for delivering pulsed RF power from a single generator to multiple distributed plasma sources in a semiconductor process system. A Single-Pole Multi-Throw (SPMT) switch, dynamically controlled in real time, selectively routes individual pulses or groups of pulses to designated plasma sources. Each pulse can be independently configured with specific RF power, frequency, and duration, allowing precise and adaptable power distribution to components such as the center and multiple edge coils of a transformer coupled plasma (TCP) source.

20 Claims, 6 Drawing Sheets

(56) References Cited

U.S. PATENT DOCUMENTS

| | | | | |
|---|---|---|---|---|
| 9,713,200 | B2 | 7/2017 | Pease | |
| 9,805,941 | B2 | 10/2017 | Kanarik et al. | |
| 9,806,252 | B2 | 10/2017 | Tan et al. | |
| 9,837,312 | B1 | 12/2017 | Tan et al. | |
| 9,870,899 | B2 | 1/2018 | Yang et al. | |
| 9,922,839 | B2 | 3/2018 | Wise et al. | |
| 9,984,858 | B2 | 5/2018 | Kanarik et al. | |
| 9,991,128 | B2 | 6/2018 | Tan et al. | |
| 9,997,371 | B1 | 6/2018 | Agarwal et al. | |
| 10,056,225 | B2 | 8/2018 | Gaff et al. | |
| 10,056,264 | B2 | 8/2018 | Yang et al. | |
| 10,096,487 | B2 | 10/2018 | Yang et al. | |
| 10,121,639 | B2 | 11/2018 | Kanarik et al. | |
| 10,208,383 | B2 | 2/2019 | George et al. | |
| 10,269,566 | B2 | 4/2019 | Tan et al. | |
| 10,304,659 | B2 | 5/2019 | Kanarik et al. | |
| 10,727,073 | B2 | 7/2020 | Tan et al. | |
| 10,749,103 | B2 | 8/2020 | Tan et al. | |
| 10,763,083 | B2 | 9/2020 | Yang et al. | |
| 10,825,659 | B2 | 11/2020 | Treadwell et al. | |
| 11,450,513 | B2 | 9/2022 | Yang et al. | |
| 11,798,785 | B2 * | 10/2023 | Long | H01J 37/321 |
| 2023/0290611 | A1 | 9/2023 | Benjiamin et al. | |
| 2024/0094056 | A1 * | 3/2024 | Voronin | G01J 3/443 |

OTHER PUBLICATIONS

Gottscho et al., "Microscopic uniformity in plasma etching", J. Vac. Sci. Technol., B10, 1992, pp. 2133-2147.
Wang et al., "Experimental demonstration of multifrequency impedance matching for tailored voltage waveform plasma", J. Vac. Sci. Technol. A37, 2019, pp. 021303 1-11.
Karanik et al., "Overview of atomic layer etching in the semiconductor industry", J. Vac. Sci. Technol. A33, 2015, pp. 020802 1-14.
Lill, "Atomic layer processing", 2021, Wiley-VCH GmbH, Boschstr. 12, 69469 Weinheim, Germany.
Karanik et al., "Predicting synergy in atomic layer etching", J. Vac. Sci. Technol. A35, 2017, pp. 05C302 1-4.
Faraz et al., "Atomic Layer Etching: What Can We Learn from Atomic Layer Deposition?", ECS Journal of Solid Sate Science and Technology, 4(6), 2015, pp. N5023-N5032.
Karanik et al., "Atomic Layer Etching: Rethinking the Art of Etch", Journal of Physical Chemistry Letters, vol. 9, Aug. 10, 2018, pp. 4814-4821.
Karanik et al., "Universal scaling relatyionship for atomic layer etching", J. Vac. Sci. Technol. A39, 2021, pp. 010401-010404.
Vella et al., "Molecular dynamics study of silicon atomic layer etching by chlorine and argon ions", J. Vac. Sci. Technol. B 40, 2022, pp. 023205-023209.

* cited by examiner

SYSTEM AND METHOD FOR DELIVERING PULSED RF POWER FROM A SINGLE GENERATOR TO DISTRIBUTED PLASMA SOURCES OF A SEMICONDUCTOR PROCESS SYSTEM

FIELD

The present disclosure relates to semiconductor manufacturing, particularly to a system and method for delivering pulsed RF power to multiple distributed plasma sources using a single RF power generator and a Single-Pole Multi-Throw (SPMT) switch. The invention is applicable to plasma-based etching and deposition processes and is particularly suited for atomic layer etching (ALE) in small process chambers, where distributed plasma sources help maintain sufficiently uniform plasma conditions.

BACKGROUND

Plasma-based semiconductor manufacturing processes, such as etching and deposition, require precise RF power delivery to maintain stable and uniform plasma conditions across the process chamber. Conventional approaches typically rely on dedicated RF power generators for each plasma source (U.S. Pat. Pub. No. 2023/0290611 by Benjamin et al.), leading to increased system complexity and cost.

In ALE applications, particularly in small process chambers, rapid process gas exchange between the surface modification and sputtering steps is required. However, achieving plasma uniformity in small chambers is significantly more challenging due to limited ion diffusion depth. Maintaining sufficiently uniform plasma conditions across the wafer surface is critical for ensuring process consistency over multiple cycles. Although ALE, due to its self-limiting nature, is less sensitive to minor variations in plasma parameters compared to other etching methods, non-uniform plasma conditions can still impact process outcomes. Therefore, an improved RF power delivery system is needed to efficiently distribute pulsed RF power to multiple plasma sources while dynamically adjusting power parameters to maintain stable and sufficiently uniform plasma conditions.

SUMMARY

In some embodiments, a system and method are provided for delivering pulsed RF power from a single RF power generator to multiple distributed plasma sources using an SPMT switch. The system includes a controller that determines a master pulse train scheme, defining pulse parameters such as power level, frequency, and duration for each plasma source. The RF power generator generates a master pulse train, which is sequentially directed to different plasma sources via the SPMT switch.

In one embodiment, the system is configured for distributed transformer-coupled plasma (TCP) sources, where each source receives RF power pulses sequentially according to an optimized schedule managed by the controller. The SPMT switch enables rapid switching between plasma sources, ensuring efficient RF power distribution while maintaining stable plasma conditions. Resonators or matching networks are incorporated to facilitate impedance matching, improving RF power transfer efficiency and minimizing power loss. This embodiment is particularly advantageous for semiconductor etching and deposition, where uniform plasma distribution across multiple TCP sources within a process chamber is essential. The system is particularly beneficial for ALE in small process chambers, where distributed sources contribute to maintaining sufficiently uniform plasma conditions to ensure process repeatability and consistency.

In another embodiment, the system incorporates sensors to monitor RF power delivery efficiency across all distributed plasma sources in real time. The sensory system includes sensors that measure reflected RF power and phase differences at selected nodes, capturing variations in impedance and power coupling efficiency. The measured data is processed by a controller and used to update an RF digital twin, a real-time simulation model that predicts and optimizes RF system behavior under varying conditions.

The RF digital twin is continuously refined based on real-time sensor data, enabling adjustments to pulse characteristics for optimized RF power delivery. Additionally, a testing load, implemented as an electronic network simulating various plasma loads, is incorporated into the system to validate generated pulse trains without interrupting active plasma processing. The controller utilizes the testing load to verify pulse performance before directing the optimized pulses to active plasma sources.

In some implementations, the system dynamically adjusts pulse characteristics, including power level, frequency, and duration, based on real-time plasma conditions at each distributed plasma source. The RF and pulse processor refines pulse parameters using insights from the RF digital twin, ensuring sufficiently uniform plasma conditions across all distributed sources.

By integrating real-time monitoring, adaptive RF pulse control, and testing load validation, the present invention enhances RF power delivery efficiency and process stability across multiple distributed plasma sources, reducing variability and improving semiconductor manufacturing efficiency. The system is particularly advantageous for ALE processes in small-size process chambers, where the use of distributed plasma sources ensures sufficiently uniform plasma conditions across the wafer surface.

BRIEF DESCRIPTION OF DRAWINGS

For enhanced clarity, the following description refers to the accompanying drawings.

DETAILED DESCRIPTION

To ensure comprehensive understanding, this section delves into detailed embodiments of the present invention.

Although certain specifics are provided for clarity, modifications and variations that align with the subsequent claims are deemed appropriate. Conventional methods and components are highlighted to underscore the distinct features of the invention.

Terms

RF Power Generator: A device that generates RF signals at one or more predetermined frequencies and delivers them to plasma sources.

Single-Pole Multi-Throw (SPMT) Switch: A switch that routes RF power from one input to multiple outputs with high-speed switching capabilities, exemplarily using GaN HEMTs.

GaN High-Electron-Mobility Transistor (GaN HEMT): A high-performance transistor made from Gallium Nitride, enabling fast switching, low conduction losses, and the ability to handle RF power up to tens of kilowatts.

Pulse Train: A series of RF pulses with defined frequency, duty cycle, and power level, used to modulate RF signals for delivery to specific loads.

Master Pulse Train: A pulse train generated by the RF power generator, modulated by a square waveform, with parameters such as duty cycle and frequency.

Controller: A component that coordinates the operation of the RF system, including pulse generation, load selection via the SPMT switch, timing synchronization, and real-time adjustments.

Impedance Matching: The process of adjusting circuit impedance to optimize RF power transfer and minimize signal reflections.

Duty Cycle: The percentage of time an RF signal remains active within a pulse cycle.

Resonator: A circuit element that helps match impedance and optimize RF power delivery to plasma sources.

Sensory System: A system comprising sensors to measure RF power delivery efficiency, including reflected power and phase difference at selected nodes.

RF Digital Twin: A simulation model of the RF system used for calibration, process optimization, and adaptive pulse generation.

Testing Load (Dummy Load): A network of electronic components, such as resistors, inductors, and capacitors, designed to simulate the behavior of plasma sources for validation and testing of RF pulse trains.

Plasma Source: A component that receives RF power to generate and sustain plasma for semiconductor processing.

Electrostatic Chuck (ESC): A substrate-holding mechanism that may receive RF power to influence plasma-surface interactions.

Figure 1A:
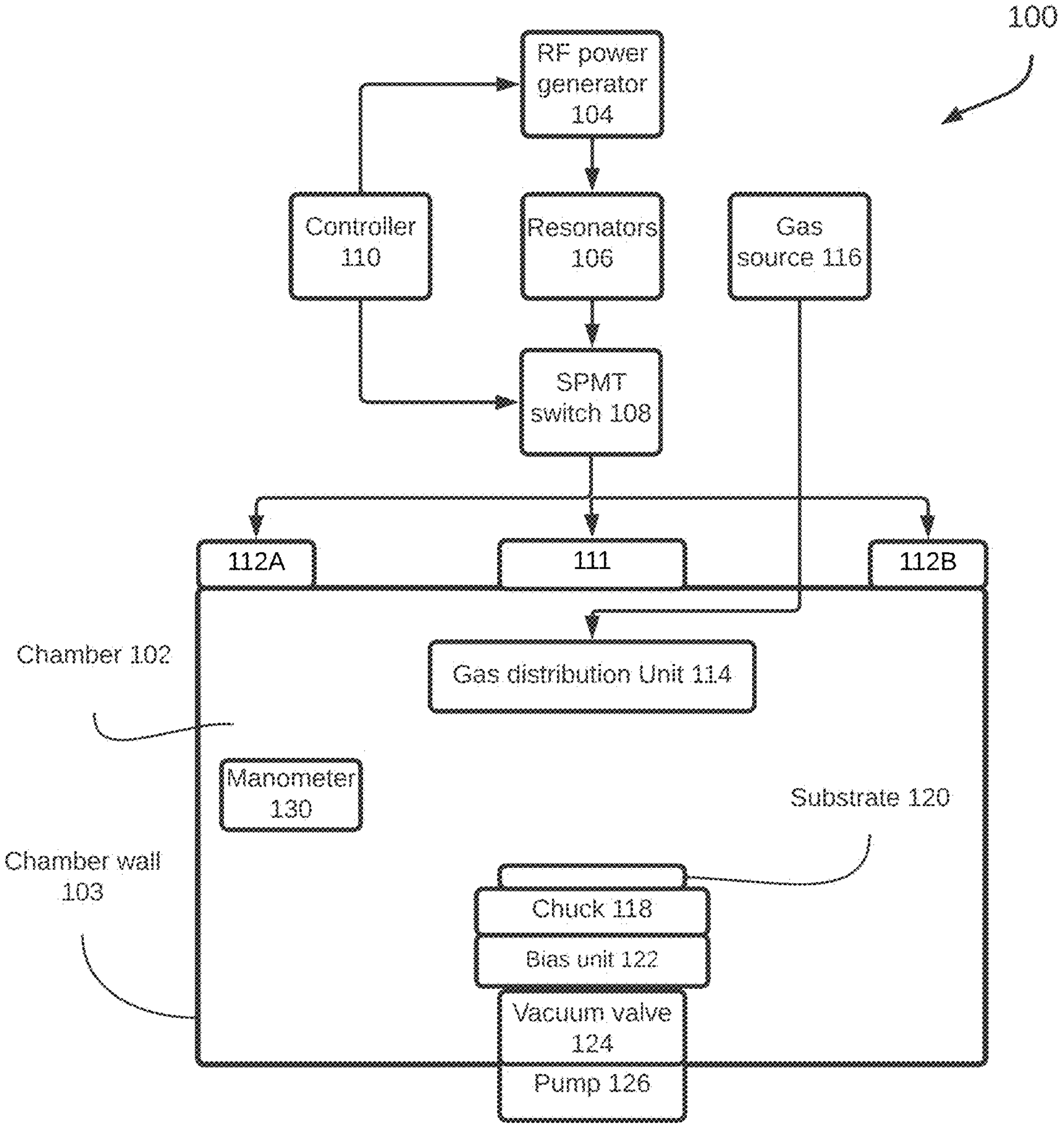
FIG. 1A: Depicts an exemplary process system utilizing distributed plasma sources powered by a single RF power generator via an SPMT switch.

FIG. 1A illustrates an exemplary process system 100 that utilizes distributed plasma sources to efficiently deliver RF power from a single RF power generator through an SPMT switch. The system includes a process chamber 102, designed to support plasma-based processes within a controlled vacuum environment, enclosed by a chamber wall 103.

Figure 1B:
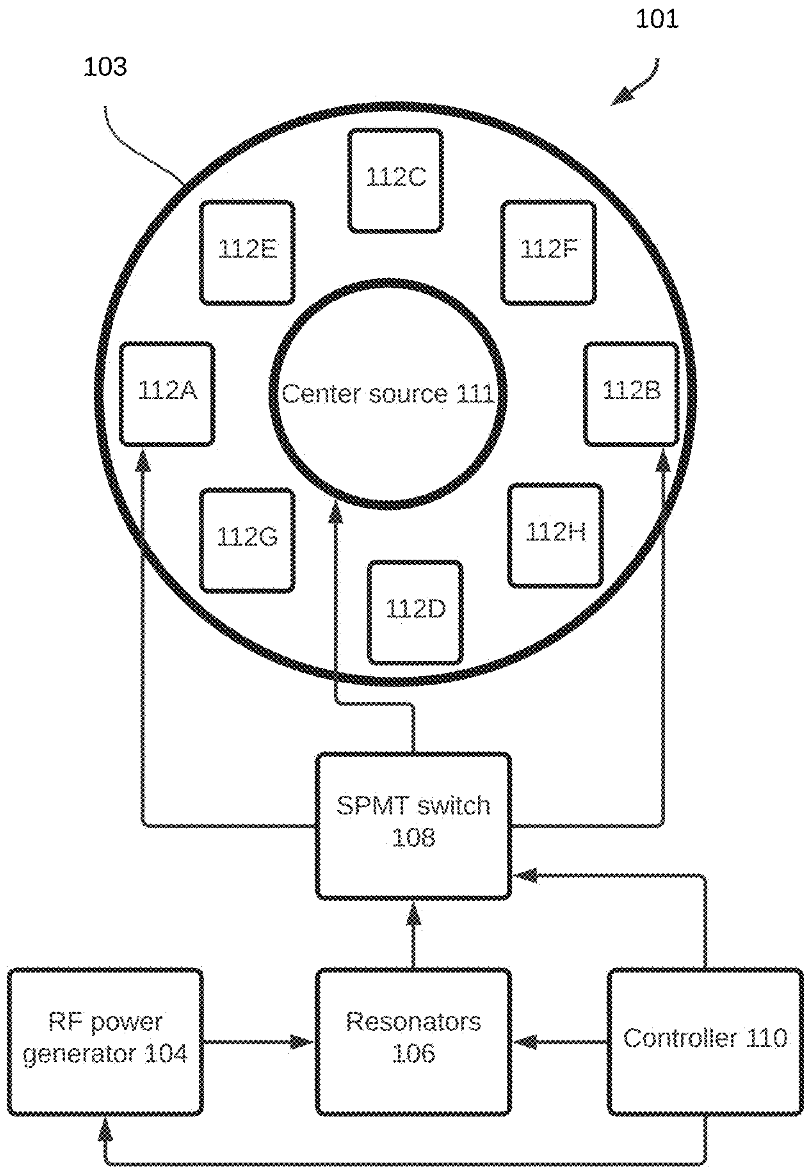
FIG. 1B: Depicts an exemplary arrangement of distributed plasma sources driven by a single RF power generator via an SPMT switch.

A distributed plasma source is positioned atop the process chamber 102. In one implementation, the distributed plasma source includes a center plasma source 111 and multiple edge plasma sources 112A-112H, as shown in FIG. 1B. The cross-sectional view in FIG. 1A captures the edge plasma sources 112A and 112B.

An RF power generator 104 supplies pulsed RF power to the center plasma source 111 and edge plasma sources 112A-112H via resonators 106 and an SPMT switch 108. The RF power generator 104 operates in a power range of 50 to 5000 watts and at frequencies such as 13.56 MHz, 2 MHz, 1 MHz, and 400 kHz. The RF power may also be pulsed according to a pulsing scheme with frequencies ranging from 100 Hz to 100 kHz. The SPMT switch 108 dynamically selects plasma sources, allowing precise control over RF power distribution.

In one embodiment, resonators 106 include multiple selectable resonators to match the impedance between the RF power generator 104 and each plasma source. The controller 110 coordinates the selection of the appropriate resonator and plasma source, ensuring efficient power delivery. In another embodiment, a single resonator with adjustable electronic components or variable operating frequency is used to accommodate different plasma sources.

The process system 100 also includes a gas distribution unit 114, which receives process gases from a gas source 116and distributes them into the process chamber 102. The gas distribution unit 114 can be configured as a showerhead or injector, with the latter requiring a dielectric window to maintain vacuum integrity while accommodating the injector.

Inside the process chamber 102, a chuck 118 holds a substrate 120 during processing. The chuck 118 may be an electrostatic chuck (ESC) or a vacuum chuck. A bias unit 122, which may include an RF power generator and/or a tailored waveform generator, applies a bias voltage to the chuck 118 to control ion energy and plasma interactions with the substrate 120.

A vacuum valve 124, located upstream of a pump 126, regulates the gas removal rate from the process chamber 102. The vacuum system maintains the desired chamber pressure by balancing gas injection and removal, with a proportional-integral-derivative (PID) control loop adjusting the pressure based on readings from a manometer 130.

The process system 100 is particularly beneficial for atomic layer etching (ALE), which relies on alternating cycles of precursor adsorption and plasma activation. ALE processes are known for their self-limiting characteristics.

In ALE applications, small-size process chambers with a plasma volume less than 10 liters are preferred to reduce gas exchange time between process steps. However, achieving plasma uniformity in such confined spaces is challenging due to limited ion diffusion depth. Maintaining sufficiently uniform plasma is essential for ensuring consistent etching rates across the wafer. The distributed plasma sources in the process system 100 address this challenge by distributing RF power across multiple locations in the chamber, reducing plasma density variations. The ability to selectively activate different plasma sources provides finer spatial control over plasma distribution, mitigating non-uniformities common in small process chambers.

The novel RF system improves the efficiency of distributed plasma sources by delivering individual or grouped pulses to a single plasma source at a time. This pulsing scheme minimizes interference between adjacent plasma sources, reducing unwanted coupling effects that can cause process instability. By selectively activating each source through controlled pulsing, the system enhances plasma uniformity and ensures consistent process conditions throughout ALE cycles. The ability to dynamically switch between plasma sources further improves uniformity by compensating for local variations in plasma density.

The system also enhances throughput by facilitating rapid gas exchange between ALE cycles. Since ALE requires alternating process gases, achieving uniform plasma conditions quickly after gas switching is critical. The distributed plasma sources, combined with controlled RF pulsing, allow for rapid stabilization of plasma conditions while adapting to fast gas composition changes. The novel RF system enables precise timing control over the activation phase of the ALE cycle, ensuring efficient ion-assisted surface reactions and reducing overall process time per wafer.

By integrating distributed plasma sources with a novel RF power system, the process system 100 enhances the performance and throughput of ALE in small process chambers. The combination of controlled RF pulsing, reduced source interference, and improved plasma uniformity makes the system particularly well-suited for ALE applications, providing greater process stability and efficiency in semiconductor manufacturing.

Figure 2:
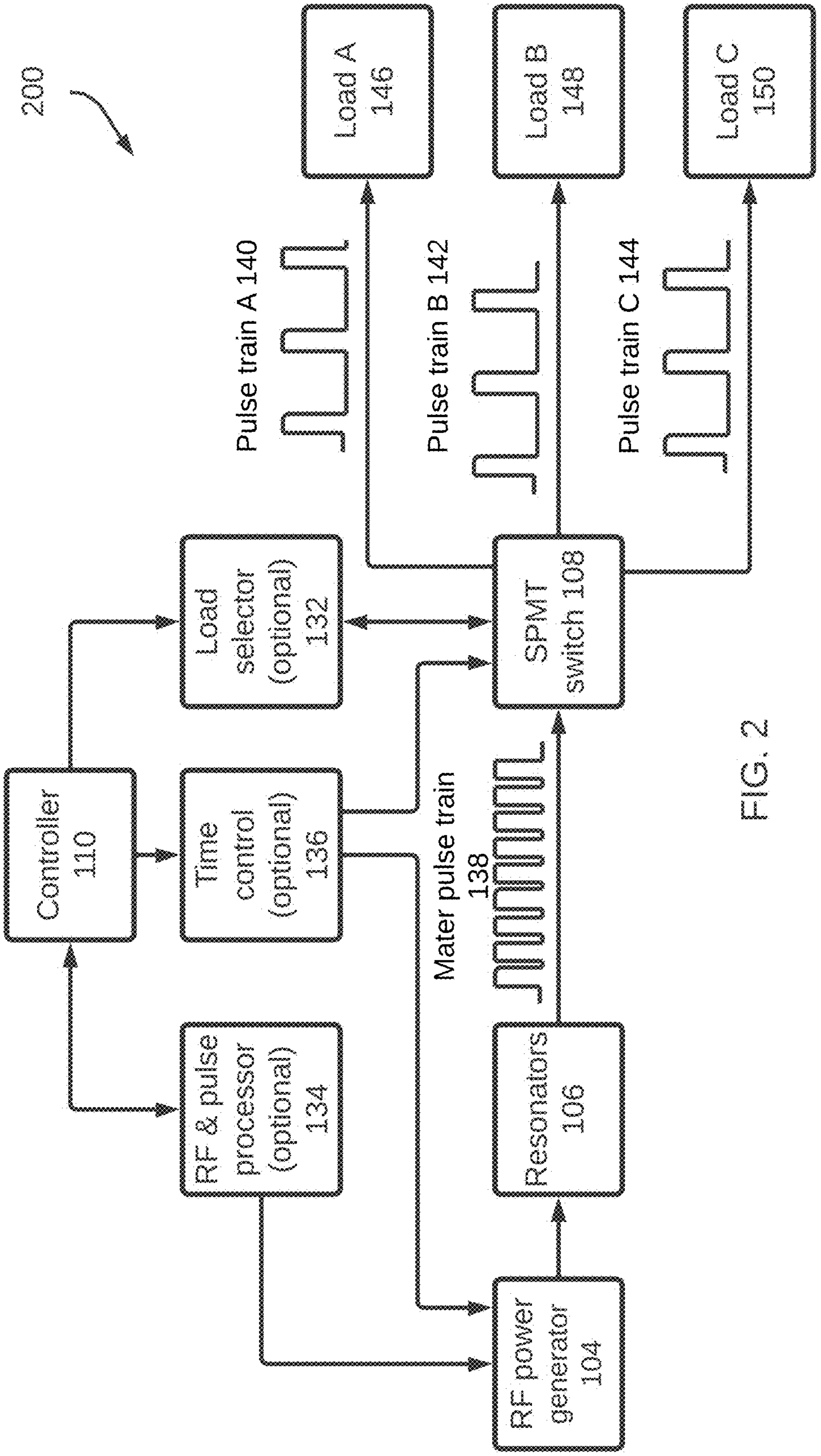
FIG. 2: Illustrates a first embodiment of an RF system for delivering RF power from a single generator to multiple loads (plasma sources).

FIG. 2 illustrates a first embodiment of an RF system 200 for delivering RF power from a single RF power generator 104 to three exemplary loads 146, 148, and 150. Each load represents a plasma source, and while three loads are depicted for illustration, the process system 100 includes a center plasma source and eight edge plasma sources, as shown in FIG. 1B. The inventive concept applies to any system with more than one plasma source.

In one implementation, the RF power generator 104 delivers RF power at a single frequency, such as 1 MHz. In another implementation, the RF power generator 104 may output multiple frequencies, such as 400 kHz, 1 MHz, and 13.56 MHz. The generator operates at a predetermined frequency within a specified output power range of 50 to 2000 watts.

The output of the RF power generator 104 is coupled to the SPMT switch 108 via resonators 106. The RF power is pulsed in the form of a master pulse train 138, achieved by imposing a square wave on the RF signals with a predefined duty cycle. The square wave frequency ranges from 100 Hz to 100 kHz, with a duty cycle between 5% and 95%.

The SPMT switch 108 is a critical component of RF system 200. In one implementation, GaN high-electron-mobility transistors (HEMTs) are used for rapid switching. GaN HEMTs are particularly suitable for this application due to their high electron mobility, wide bandgap, and excellent thermal conductivity, enabling operation at high switching frequencies up to several hundred megahertz and handling power levels up to tens of kilowatts. These properties make GaN HEMTs ideal for semiconductor manufacturing process systems that require rapid and precise RF power control.

The SPMT switch 108 utilizes multiple GaN HEMTs arranged to connect the RF power generator 104 output to multiple loads, as illustrated in FIG. 2. The nanosecond-to-microsecond switching speed of GaN HEMTs ensures precise timing and controlled RF power distribution, even in high-demand plasma process environments.

Additionally, GaN HEMTs exhibit low conduction losses and high breakdown voltage, ensuring reliable performance in high-power RF systems. These characteristics make them suitable for handling power levels exceeding tens of kilowatts, which are often required for modern semiconductor manufacturing.

Alternatively, the SPMT switch 108 can be constructed using silicon power transistors, such as Si MOSFETs or SiC MOSFETs, or implemented with mechanical relays.

A controller 110 manages the operation of RF system 200, selecting a load via the SPMT switch 108 for each pulse in the master pulse train 138. In some implementations, the controller 110 includes a load selector 132, which may be implemented in software, firmware, hardware, or a combination thereof. The controller 110 may also include a pulse counter to track and label each pulse.

An optional time control 136 coordinates pulse generation in the RF power generator 104 with switching operations in the SPMT switch 108. For example, delays between pulse generation and switching operations can be modeled or measured and stored in a storage unit of the controller 110. The time control 136 uses this data to ensure precise pulse delivery to the designated load and may be implemented as software, firmware, hardware, or a combination thereof.

The SPMT switch 108 outputs three pulse trains, designated as pulse train A 140, pulse train B 142, and pulse train C 144. These pulse trains have a lower duty cycle than the master pulse train 138. In one implementation, the sum of the duty cycles of pulse trains 140, 142, and 144 equals the duty cycle of the master pulse train 138. In another implementation, multiple pulses may be grouped and delivered to a selected load instead of sending individual pulses.

In a more generalized implementation, each pulse may vary in RF frequency, power level, or duration. An optional RF and pulse processor 134 can modify each pulse under the supervision of the controller 110. The RF and pulse processor 134 may be implemented in software, firmware, hardware, or a combination thereof.

Figure 3:
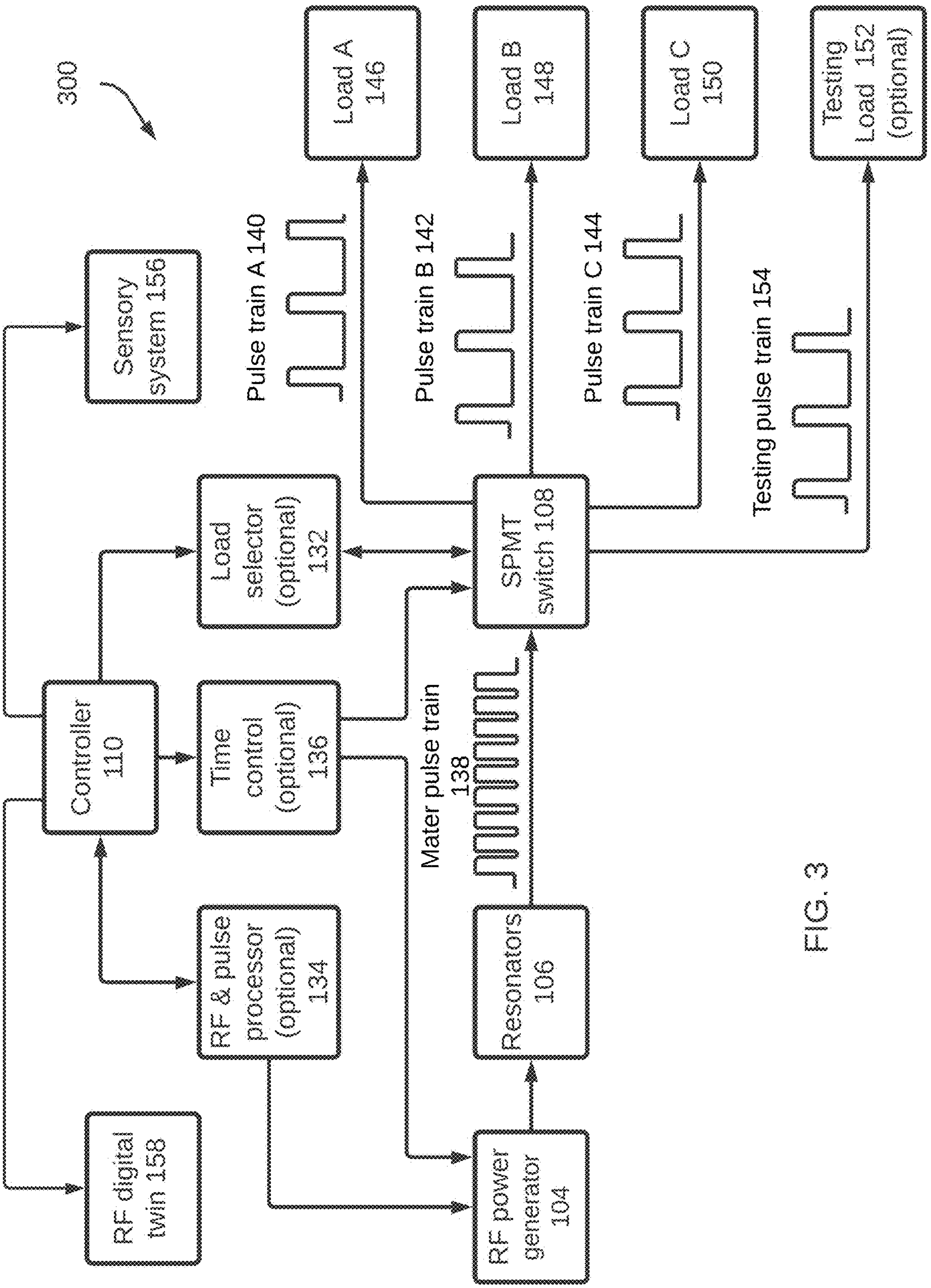
FIG. 3: Illustrates a second embodiment of an RF system for delivering RF power from a single generator to multiple loads (plasma sources), incorporating a sensory system for performance evaluation.

FIG. 3 illustrates a second embodiment of an RF system 300 for delivering RF power from a single RF power generator to multiple loads. A sensory system 156 is added to the first embodiment 200 to evaluate the efficiency of RF power delivery to each RF load. The sensory system 156 may include a sensor, such as a directional coupler with power meters, for measuring the reflected RF power from the load. Additionally, the sensory system 156 may incorporate a phase sensor to measure the phase difference at selected nodes, such as the resonating node of the resonators 106, where the AC current and voltage are expected to be in phase.

The measured data is captured by the controller 110 and stored in a storage unit. In one aspect, the controller 110 may incorporate an RF digital twin 158 that mimics the operation of the RF system. The measured data can be used to calibrate or improve the RF digital twin 158 in real time. The RF and pulse processor 134 can then utilize the calibrated RF digital twin 158 to generate optimized pulses for all loads 146, 148, and 150.

In another aspect of the second embodiment, a testing or dummy load 152 is included. The load 152 consists of a network of electronic components, such as resistors, inductors, and capacitors, designed to mimic each of the loads (plasma sources). The load 152 may be programmable to simulate different plasma states. The controller 110 can use the testing load 152 to evaluate the performance of the generated pulse train 154 in the background without interrupting the operation of the RF system 300.

The duty cycle of the master pulse train should be sufficiently low to accommodate multiple loads along with the testing load.

Figure 4:
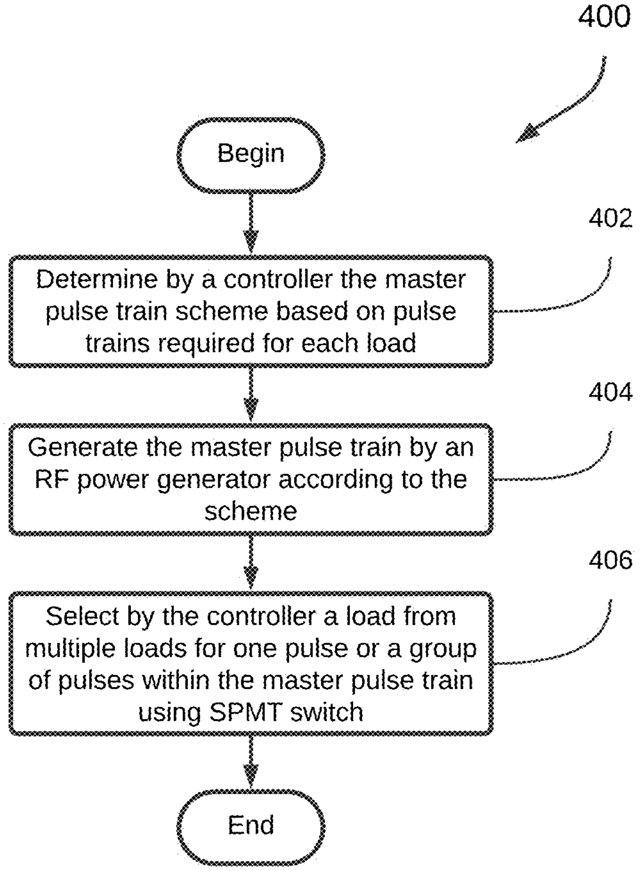
FIG. 4: Presents a flowchart illustrating the process of delivering pulsed RF power to distributed plasma sources according to the first embodiment of the RF system.

FIG. 4 depicts a flowchart for a method of delivering RF power to multiple loads. Process 400 begins with step 402, where the controller 110 determines the master pulse train scheme based on the pulse train requirements for each load (plasma source). The controller 110 may assign different power levels, frequencies, and durations to each pulse in the master pulse train. This approach enables the optimization of RF power delivery to each load (plasma source), enhancing the performance of semiconductor process systems, including etching and deposition systems.

In step 404, the controller 110 generates the master pulse train 138 according to the determined scheme. In step 406, each pulse is delivered to a specific load (plasma source) via the SPMT switch 108 under the supervision of the controller 110.

Figure 5:
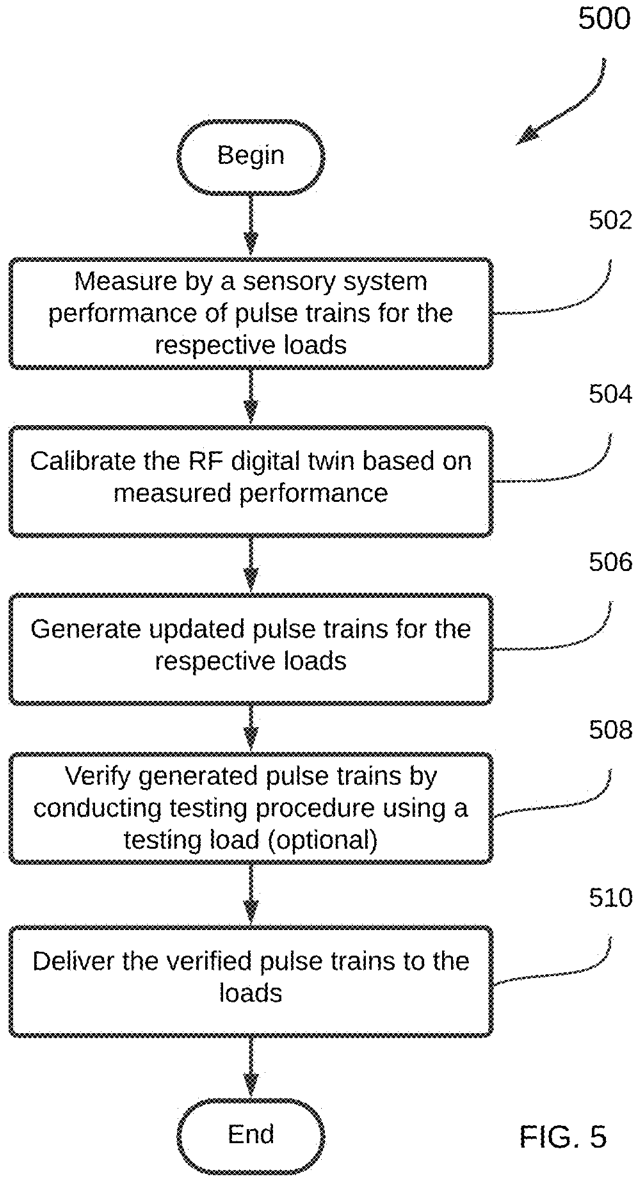
FIG. 5: Presents a flowchart illustrating the process of delivering pulsed RF power to distributed plasma sources according to the second embodiment of the RF system.

FIG. 5 presents a flowchart for process 500, which describes a method for delivering pulsed RF power to distributed plasma sources according to the second embodiment 300 of the RF system. Process 500 starts with step 502, where the performance of the RF system 300 is evaluated by the sensory system 156. For example, reflected RF power may be measured using a directional coupler with power meters. RF power delivery performance can also be assessed using a phase sensor at the resonating nodes of the resonators 106, where the AC current and voltage are expected to be in phase.

In step 504, the RF digital twin 158 is optionally calibrated based on the measured performance. The RF digital twin 158 may incorporate a model, such as a SPICE model, representing the RF circuits, including the loads that simulate the plasma within the process chamber 102. The calibration may also be carried out after measurements are accumulated sufficiently over a period of time. Additionally, the RF digital twin 158 may utilize trained neural networks, which can be trained using simulation data derived from a model and/or measured data. The performance data captured by the sensory system 156 can be used to retrain the neural network in real time.

In step 506, pulse trains for at least some loads are updated based on the calibrated RF digital twin 158. In step 508, the generated pulse trains are optionally validated by delivering them to the testing loads 152 and measuring their corresponding performance.

In step 510, the verified pulse trains are integrated into the updated master pulse train and delivered to each load using the SPMT switch 108.

The invention claimed is:

1. An RF system for a semiconductor process system, comprising:
- an RF power generator configured to generate RF power in the form of a master pulse train;
- a plurality of plasma sources configured to receive a subset of the pulses from the master pulse train, wherein the plasma sources are arranged atop a process chamber configured to generate plasma within the chamber;
- a Single-Pole Multi-Throw (SPMT) switch configured to select a plasma source from the plurality of plasma sources to receive one pulse or a group of the pulses in the master pulse train; and
- a controller configured to coordinate the operations of the RF power generator and the SPMT switch.

2. The system of claim 1, wherein the plasma sources comprise transformer coupled plasma (TCP) sources.

3. The system of claim 2, wherein the TCP plasma sources include a center coil and a plurality of edge coils.

4. The system of claim 1, further comprising a time control unit configured to coordinate the timing of pulse generation and plasma source selection by the SPMT switch.

5. The system of claim 1, further comprising an RF and pulse processor configured to modify each pulse in the master pulse train.

6. The system of claim 5, wherein the processor is configured to assign a power level, RF frequency, or pulse duration.

7. The system of claim 1, wherein the SPMT switch comprises one or more GaN HEMTs.

8. The system of claim 1, further comprising a plurality of resonators, each associated with a plasma source.

9. The system of claim 1, further comprising a shared resonator for the plurality of plasma sources, the shared resonator including electrically tunable components.

10. The system of claim 1, wherein the RF system is a part of an atomic layer etching (ALE) process system.

11. The system of claim 10, wherein the plasma volume of the process chamber is less than 10 liters.

12. An RF system for a semiconductor process system, comprising:
- an RF power generator configured to generate RF power in the form of a master pulse train;
- a plurality of plasma sources configured to receive a subset of the pulses from the master pulse train;
- a SPMT switch configured to select a plasma source from the plurality of plasma sources to receive one pulse or a group of the pulses in the master pulse train;
- a sensory system configured to monitor the performance of the RF power delivery to each plasma source;
- a testing load comprising an electronic network configured to mimic the electrical characteristics of the plasma sources; and
- a controller configured to coordinate the operations of the RF power generator and the SPMT switch,
- wherein the controller includes an RF digital twin configured to mimic the operations of the RF system, and
- wherein the controller further configured to test the performance of generated pulse trains by utilizing the testing load.

13. The system of claim 12, wherein the sensory system includes one or more directional couplers.

14. The system of claim 12, wherein the sensory system includes one or more phase sensors.

15. The system of claim 12, wherein the digital twin includes a SPICE model.

16. The system of claim 15, wherein the SPICE model is calibrated based on data measured by the sensory system.

17. The system of claim 12, wherein the digital twin includes a neural network.

18. The system of claim 17, wherein the neural network is trained using simulation data generated from the RF digital twin.

19. The system of claim 17, wherein the neural network is trained in real time using data measured by the sensory system.

20. The system of claim 12, wherein the testing load receives an RF pulse train as a part of the master pulse train.

* * * * *